US012646582B2

(12) United States Patent
Gupta et al.

(10) Patent No.: US 12,646,582 B2
(45) Date of Patent: Jun. 2, 2026

(54) DATA STORAGE DEVICE AND METHOD FOR DYNAMIC BIT-ERROR-RATE ESTIMATION SCAN (BES)

(71) Applicant: Sandisk Technologies, Inc., Milpitas, CA (US)

(72) Inventors: Mahim Gupta, San Jose, CA (US); Jia Li, San Francisco, CA (US); Sugandha Sharma, Pleasanton, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 64 days.

(21) Appl. No.: 18/903,283

(22) Filed: Oct. 1, 2024

(65) Prior Publication Data

US 2026/0094660 A1     Apr. 2, 2026

(51) Int. Cl.
*G11C 29/44* (2006.01)
*G11C 16/34* (2006.01)
*G11C 16/26* (2006.01)
*G11C 29/50* (2006.01)

(52) U.S. Cl.
CPC ............ *G11C 29/44* (2013.01); *G11C 16/349* (2013.01); *G11C 16/26* (2013.01); *G11C 29/50004* (2013.01)

(58) Field of Classification Search
CPC ....... G11C 16/26; G11C 16/349; G11C 29/44; G11C 29/50004
See application file for complete search history.

(56) References Cited

U.S. PATENT DOCUMENTS

| | | | | |
|---|---|---|---|---|
| 9,697,905 | B2 | 7/2017 | Sharon et al. | |
| 10,991,444 | B1 * | 4/2021 | Bazarsky | G11C 29/42 |
| 11,217,320 | B1 * | 1/2022 | Sheperek | G11C 16/30 |
| 11,437,108 | B1 * | 9/2022 | Muchherla | G11C 16/34 |
| 11,488,684 | B1 | 11/2022 | Sharon et al. | |
| 2006/0083067 | A1 * | 4/2006 | Ueda | G11C 29/028 365/185.18 |
| 2012/0008386 | A1 * | 1/2012 | Chilappagari | G11C 11/5642 365/185.2 |
| 2013/0077400 | A1 * | 3/2013 | Sakurada | G11C 16/06 365/185.03 |
| 2017/0255403 | A1 * | 9/2017 | Sharon | G06F 3/064 |
| 2018/0190348 | A1 * | 7/2018 | Tokutomi | G11C 16/0483 |
| 2019/0189202 | A1 * | 6/2019 | Avraham | G11C 16/3418 |
| 2019/0287640 | A1 * | 9/2019 | Takahashi | G11C 29/52 |
| 2022/0076738 | A1 * | 3/2022 | Bazarsky | G11C 29/028 |
| 2023/0368845 | A1 * | 11/2023 | Rao | G11C 11/5642 |
| 2023/0393991 | A1 * | 12/2023 | Chang | G06F 12/0692 |
| 2024/0185928 | A1 * | 6/2024 | Prakash | G11C 16/26 |
| 2024/0185943 | A1 * | 6/2024 | Kale | G11C 29/021 |
| 2024/0249783 | A1 * | 7/2024 | Rozman | G11C 16/0483 |
| 2025/0118376 | A1 * | 4/2025 | Shenoy | G11C 16/16 |
| 2025/0266112 | A1 * | 8/2025 | Tang | G11C 16/349 |
| 2025/0285687 | A1 * | 9/2025 | Zhao | G11C 16/08 |

* cited by examiner

*Primary Examiner* — Steve N Nguyen
(74) *Attorney, Agent, or Firm* — Crowell & Moring LLP

(57) ABSTRACT

A sensed read threshold voltage can sometimes vary from a write threshold voltage due to one or more factors, such as data retention issues and program disturb conditions. A bit-error-rate estimation scan (BES) can be used to calibrate and optimize read thresholds in this situation. However, as more wordlines are introduced, BES may not provide suitable calibration. In such situations, the BES can be re-performed on certain pages using an additional offset.

20 Claims, 11 Drawing Sheets

Figures 1A, 1B:
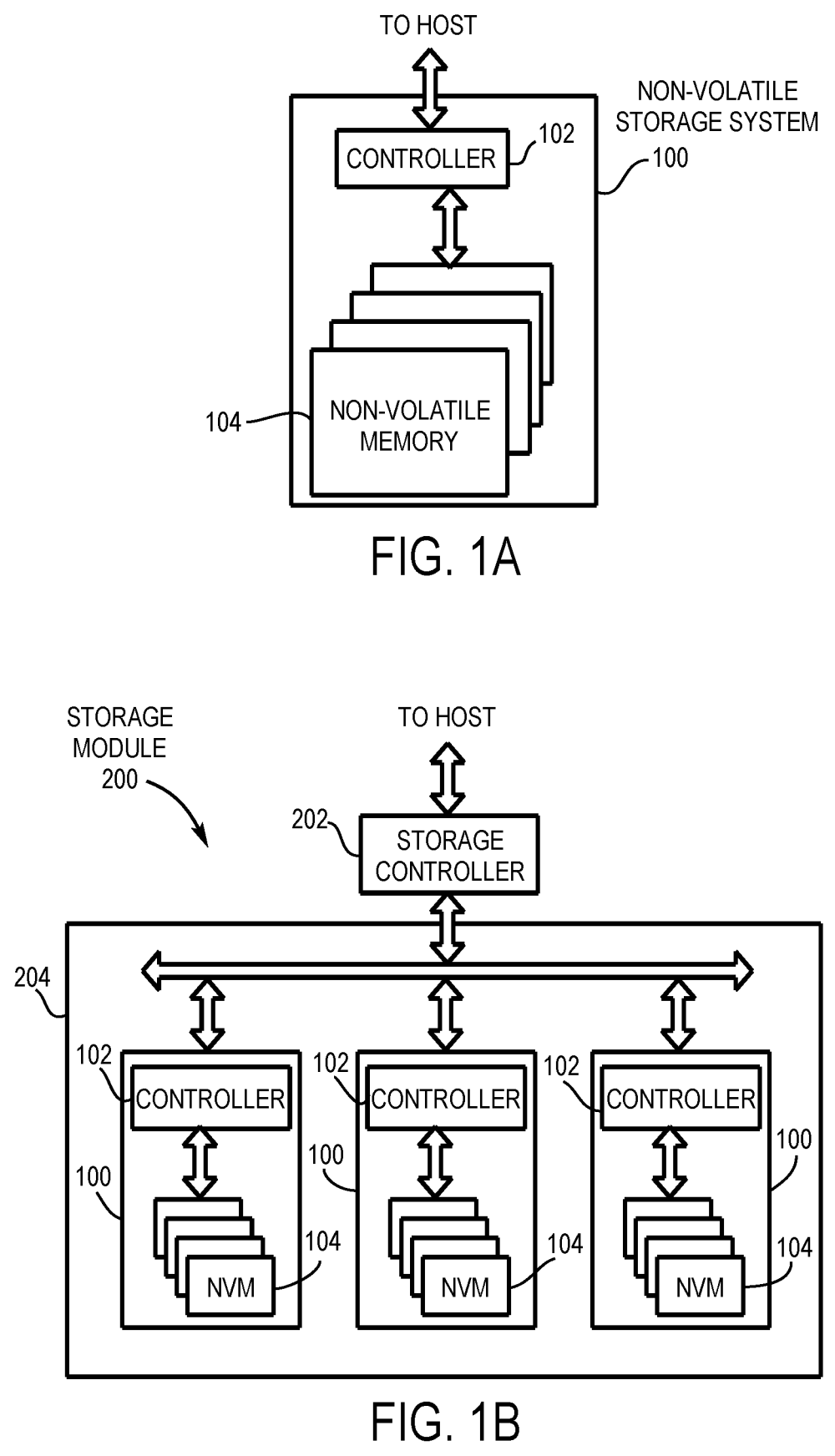

TO HOST

NON-VOLATILE STORAGE SYSTEM

CONTROLLER 102

100

NON-VOLATILE MEMORY

STORAGE MODULE 200

TO HOST

202 STORAGE CONTROLLER

204

102 CONTROLLER

102 CONTROLLER

102 CONTROLLER

100

100

100

104 NVM

104 NVM

104 NVM

ONE OR MORE
PROCESSORS

ONE OR MORE
MEMORIES

HOST

CONTROLLER

MEMORY
DIE(s)

STORAGE SYSTEM

102

100

104

DATA STORAGE DEVICE AND METHOD FOR DYNAMIC BIT-ERROR-RATE ESTIMATION SCAN (BES)

BACKGROUND

A data storage device contains a memory to store data. To increase storage density, multi-level cells (MLCs) can be used to store more than one bit per memory cell in the memory. In operation, after determining a sequence of bits to store in a particular memory cell, the memory cell is programmed to a state by setting a threshold voltage that corresponds to a sequence of bits. To read the memory cell, the memory cell is sensed, and the memory cell's threshold voltage is compared to one or more read voltages. However, the sensed threshold voltage can sometimes vary from the written threshold voltage due to one or more factors, such as process variation, data retention issues, and program disturb conditions.

BRIEF DESCRIPTION OF THE DRAWINGS

FIG. 1A is a block diagram of a data storage device of an embodiment.

FIG. 1B is a block diagram illustrating a storage module of an embodiment.

DETAILED DESCRIPTION

The following embodiments generally relate to a data storage device and method for dynamic bit-error-rate estimation scan (BES). In one embodiment, a data storage device is provided comprising a memory and one or more processors. The one or more processors, individually or in combination, are configured to: perform a first bit-error-rate estimation scan (BES) on a scan range in the memory, wherein the BES is performed using a first offset; determine whether a page in the scan range comprises digital-to-analog conversion (DAC) shifts below a criterion; and in response to determining that the page in the scan range comprises DAC shifts below the criterion, perform a second BES on the page, wherein the second BES is performed using a second offset.

In another embodiment, a method is provided that is performed in a data storage device comprising a memory.

The method comprises: commencing a bit-error-rate estimation scan of a page of the memory; determining whether the page is associated with an offset pool; and in response to determining that the page is associated with the offset pool, proceeding with the bit-error-rate estimation scan of the page using an updated offset.

In yet another embodiment, a data storage device is provided comprising: a memory and means for: performing a first bit-error-rate estimation scan (BES) on a scan range in the memory, wherein the BES is performed using a first offset; identifying a page in the scan range that comprises digital-to-analog conversion (DAC) shifts below a criterion; and performing a second BES on the page, wherein the second BES is performed using a second offset.

Other embodiments are possible, and each of the embodiments can be used alone or together in combination. Accordingly, various embodiments will now be described with reference to the attached drawings.

Embodiments

The following embodiments relate to a data storage device (DSD). As used herein, a "data storage device" refers to a non-volatile device that stores data. Examples of DSDs include, but are not limited to, hard disk drives (HDDs), solid state drives (SSDs), tape drives, hybrid drives, etc. Details of example DSDs are provided below.

Figure 1C:
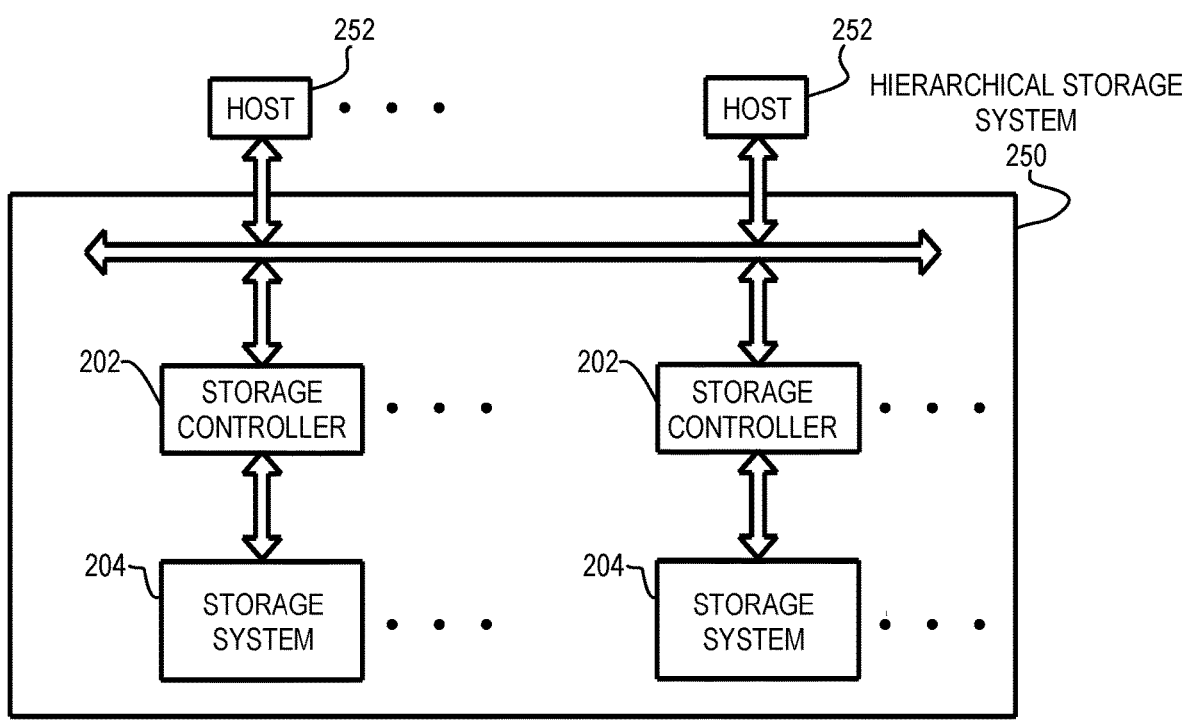
FIG. 1C is a block diagram illustrating a hierarchical storage system of an embodiment.

Examples of data storage devices suitable for use in implementing aspects of these embodiments are shown in FIGS. 1A-1C. It should be noted that these are merely examples and that other implementations can be used. FIG. 1A is a block diagram illustrating the data storage device 100 according to an embodiment. Referring to FIG. 1A, the data storage device 100 in this example includes a controller 102 coupled with a non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. The controller 102 interfaces with a host system and transmits command sequences for read, program, and erase operations to non-volatile memory die 104. Also, as used herein, the phrase "in communication with" or "coupled with" could mean directly in communication/coupled with or indirectly in communication/coupled with through one or more components, which may or may not be shown or described herein. The communication/coupling can be wired or wireless.

Figure 2A:
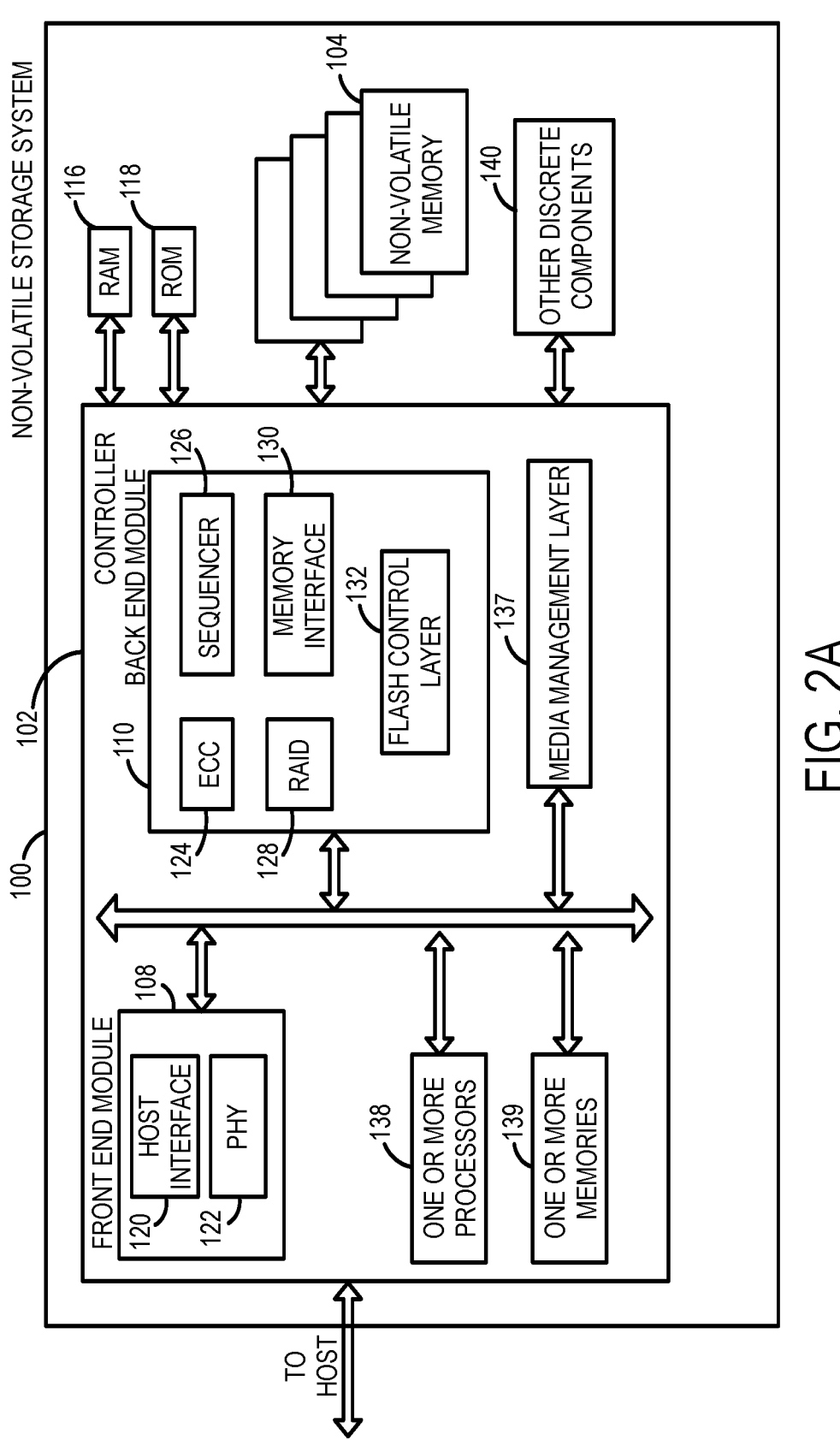
FIG. 2A is a block diagram illustrating components of the controller of the data storage device illustrated in FIG. 1A according to an embodiment.

The controller 102 (which may be a non-volatile memory controller (e.g., a flash, resistive random-access memory (ReRAM), phase-change memory (PCM), or magnetoresistive random-access memory (MRAM) controller)) can include one or more components, individually or in combination, configured to perform certain functions, including, but not limited to, the functions described herein and illustrated in the flow charts. For example, as shown in FIG. 2A, the controller 102 can comprise one or more processors 138 that are, individually or in combination, configured to perform functions, such as, but not limited to the functions described herein and illustrated in the flow charts, by executing computer-readable program code stored in one or more non-transitory memories 139 inside the controller 102 and/or outside the controller 102 (e.g., in random access memory (RAM) 116 or read-only memory (ROM) 118). As another example, the one or more components can include circuitry, such as, but not limited to, logic gates, switches, an application specific integrated circuit (ASIC), a programmable logic controller, and an embedded microcontroller.

In one example embodiment, the non-volatile memory controller 102 is a device that manages data stored on non-volatile memory and communicates with a host, such as a computer or electronic device, with any suitable operating system. The non-volatile memory controller 102 can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware (and/or other metadata used for housekeeping and tracking) to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC) (e.g., dual-level cells, triple-level cells (TLC), quad-level cells (QLC), etc.) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, the data storage device 100 may be a card-based system, such as a secure digital (SD) or a micro secure digital (micro-SD) card. In an alternate embodiment, the data storage device 100 may be part of an embedded data storage device.

Although, in the example illustrated in FIG. 1A, the data storage device 100 (sometimes referred to herein as a storage module) includes a single channel between controller 102 and non-volatile memory die 104, the subject matter described herein is not limited to having a single memory channel. For example, in some architectures (such as the ones shown in FIGS. 1B and 1C), two, four, eight or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile data storage devices 100. As such, storage module 200 may include a storage controller 202 that interfaces with a host and with data storage device 204, which includes a plurality of data storage devices 100. The interface between storage controller 202 and data storage devices 100 may be a bus interface, such as a serial advanced technology attachment (SATA), peripheral component interconnect express (PCIe) interface, double-data-rate (DDR) interface, or serial attached small scale compute interface (SAS/SCSI). Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective data storage device 204. Host systems 252 may access memories within the storage system 250 via a bus interface. In one embodiment, the bus interface may be a Non-Volatile Memory Express (NVMe) or Fibre Channel over Ethernet (FCOE) interface. In one embodiment, the system illustrated in FIG. 1C may be a rack mountable mass storage system that is accessible by multiple host computers, such as would be found in a data center or other location where mass storage is needed.

Referring again to FIG. 2A, the controller 102 in this example also includes a front-end module 108 that interfaces with a host, a back-end module 110 that interfaces with the one or more non-volatile memory die 104, and various other components or modules, such as, but not limited to, a buffer manager/bus controller module that manage buffers in RAM 116 and controls the internal bus arbitration of controller 102. A module can include one or more processors or components, as discussed above. The ROM 118 can store system boot code. Although illustrated in FIG. 2A as located separately from the controller 102, in other embodiments one or both of the RAM 116 and ROM 118 may be located within the controller 102. In yet other embodiments, portions of RAM 116 and ROM 118 may be located both within the controller 102 and outside the controller 102.

Front-end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back-end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. The controller 102 in this example also comprises a media management layer 137 and a flash control layer 132, which controls the overall operation of back-end module 110.

The data storage device 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller are optional components that are not necessary in the controller 102.

Figure 2B:
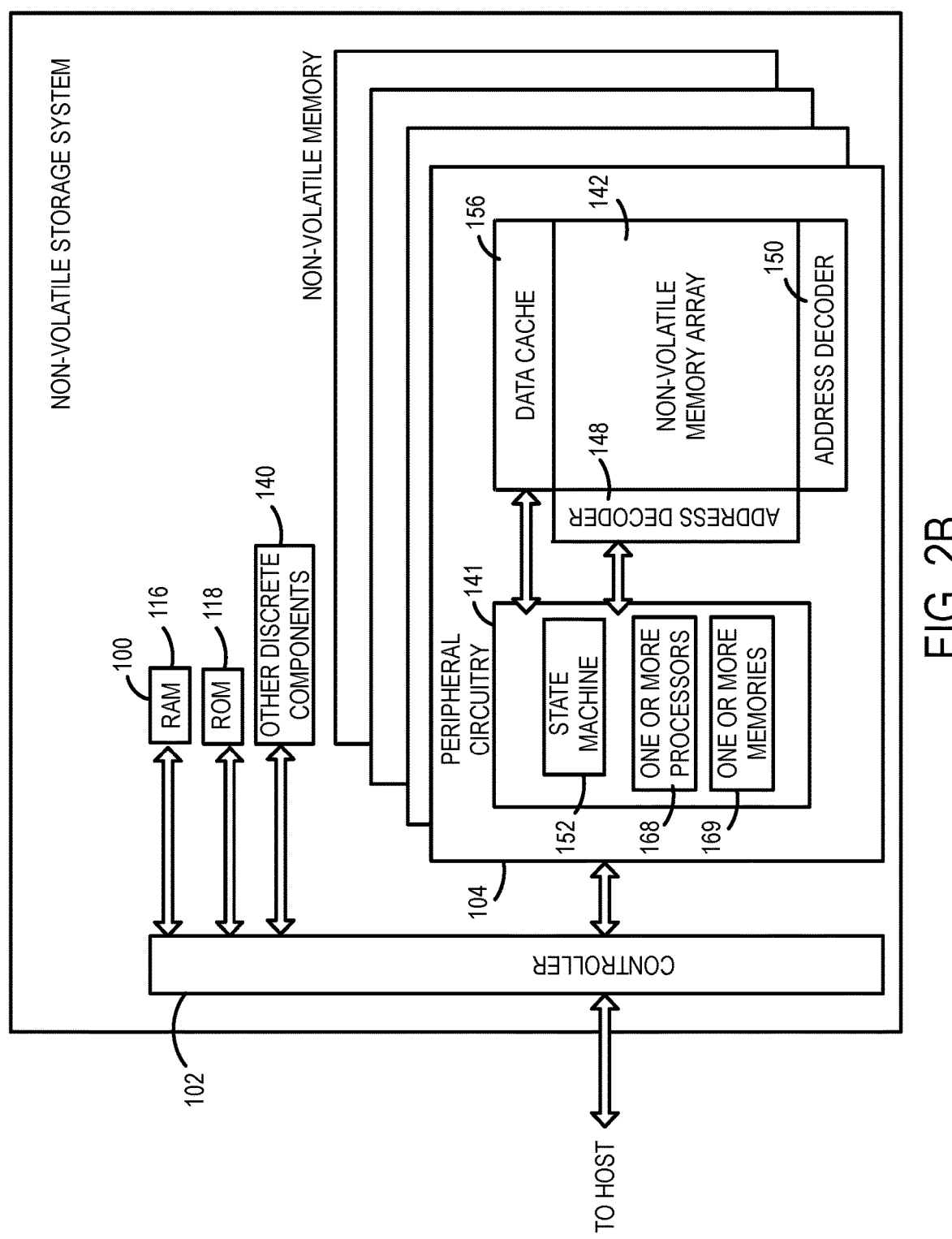
FIG. 2B is a block diagram illustrating components of the data storage device illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two-dimensional and/or three-dimensional configuration. Non-volatile memory die 104 further includes a data cache 156 that caches data and address decoders 148, 150. The peripheral circuitry 141 in this example includes a state machine 152 that provides status information to the controller 102. The peripheral circuitry 141 can also comprise one or more components that are, individually or in combination, configured to perform certain functions, including, but not limited to, the functions described herein and illustrated in the flow charts. For example, as shown in FIG. 2B, the memory die 104 can comprise one or more processors 168 that are, individually or in combination, configured to execute computer-readable program code stored in one or more non-transitory memories 169, stored in the memory array 142, or stored outside the memory die 104. As another example, the one or more components can include circuitry, such as, but not limited to, logic gates, switches, an application specific integrated circuit (ASIC), a programmable logic controller, and an embedded microcontroller.

In addition to or instead of the one or more processors 138 (or, more generally, components) in the controller 102 and the one or more processors 168 (or, more generally, components) in the memory die 104, the data storage device 100 can comprise another set of one or more processors (or, more generally, components). In general, wherever they are located and however many there are, one or more processors (or, more generally, components) in the data storage device 100 can be, individually or in combination, configured to perform various functions, including, but not limited to, the functions described herein and illustrated in the flow charts. For example, the one or more processors (or components) can be in the controller 102, memory device 104, and/or other location in the data storage device 100. Also, different functions can be performed using different processors (or components) or combinations of processors (or components). Further, means for performing a function can be implemented with a controller comprising one or more components (e.g., processors or the other components described above).

Returning again to FIG. 2A, the flash control layer 132 (which will be referred to herein as the flash translation layer (FTL) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may be written in only multiples of pages, and/or may not be written unless it is erased as a block. The FTL understands these potential limitations of the memory 104, which may not be visible to the host.

Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
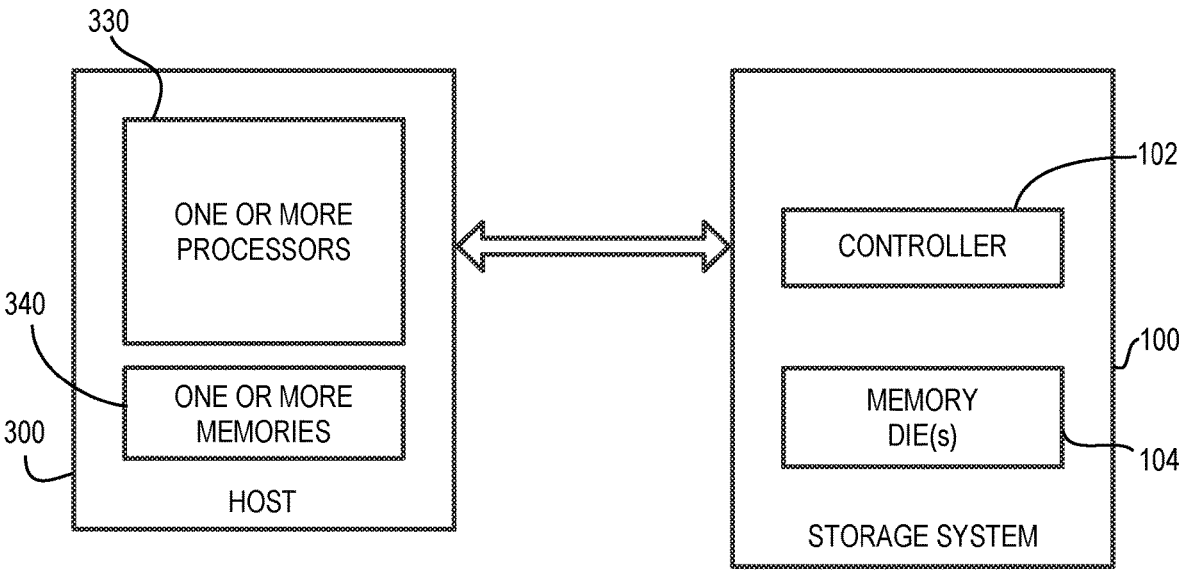
FIG. 3 is a block diagram of a host and a data storage device of an embodiment.

Turning again to the drawings, FIG. 3 is a block diagram of a host 300 and data storage device 100 of an embodiment. The host 300 can take any suitable form, including, but not limited to, a computer, a mobile phone, a tablet, a wearable device, a digital video recorder, a surveillance system, etc. The host 300 in this embodiment (here, a computing device) comprises one or more processors 330 and one or more memories 340. In one embodiment, computer-readable program code stored in the one or more memories 340 configures the one or more processors 330 to perform the acts described herein as being performed by the host 300. So, actions performed by the host 300 are sometimes referred to herein as being performed by an application (computer-readable program code) run on the host 300. For example, the host 300 can be configured to send data (e.g., initially stored in the host's memory 340) to the data storage device 100 for storage in the data storage device's memory 104.

As mentioned above, multi-level cells (MLCs) can be used to store more than one bit per memory cell in the memory 104. In operation, after determining a sequence of bits to store in a particular memory cell, the memory cell is programmed to a state by setting a threshold voltage that corresponds to a sequence of bits. To read the memory cell, the memory cell is sensed, and the memory cell's threshold voltage is compared to one or more read voltages. However, the sensed threshold voltage can sometimes vary from the written threshold voltage due to one or more factors, such as data retention issues and program disturb conditions. As such, the default read thresholds that are used to read from the memory (e.g., Flash) in a new device may not be suitable for a device that has sustained such conditions.

There are several methods that can be used to help recalibrate a read threshold. For example, valley search (VS) is an algorithm that can be used to optimize a read threshold by finding the minima on a cell voltage distribution (CVD) histogram between every two adjacent states. It is typically implemented inside the NAND die, but a controller-based version of valley search can be used. A bit error rate (BER) estimation scan (BES) is another method to calibrate and optimize read thresholds. BES relies on optimizing the read threshold such that syndrome weight (SW), which is a proxy for the bit error rate, is minimized. Optimizing the syndrome weight/bit error rate has benefits over optimizing the minima of a CVD histogram as it reduces the object function directly, while the minima on a CVD histogram does not always translate into bit error rate minima.

BES-based CVD ("BES-CVD") is a method for obtaining optimal read level shifts. In operation, firmware in the controller 102 can perform five or seven NAND senses (in BES5 or BES7, respectively) and transfer one flash management unit (FMU) (e.g., 4K) of data to hardware (e.g., in the controller 102) to calculate an optimal read level that will provide minimum syndrome weight or failed bit count. As such, BES-CVD is a hardware-managed operation to produce updated optimized voltage read thresholds. This operation is based on the actual syndrome-weight (which is equivalent to the BER) at a relatively-low-resolution read operation. BES-CVD is relatively fast and simple to use. In one example, the BES5 comb center is at a default read plus an offset, and the BES7 comb center is at an optimal read level from BES5.

Figure 4:
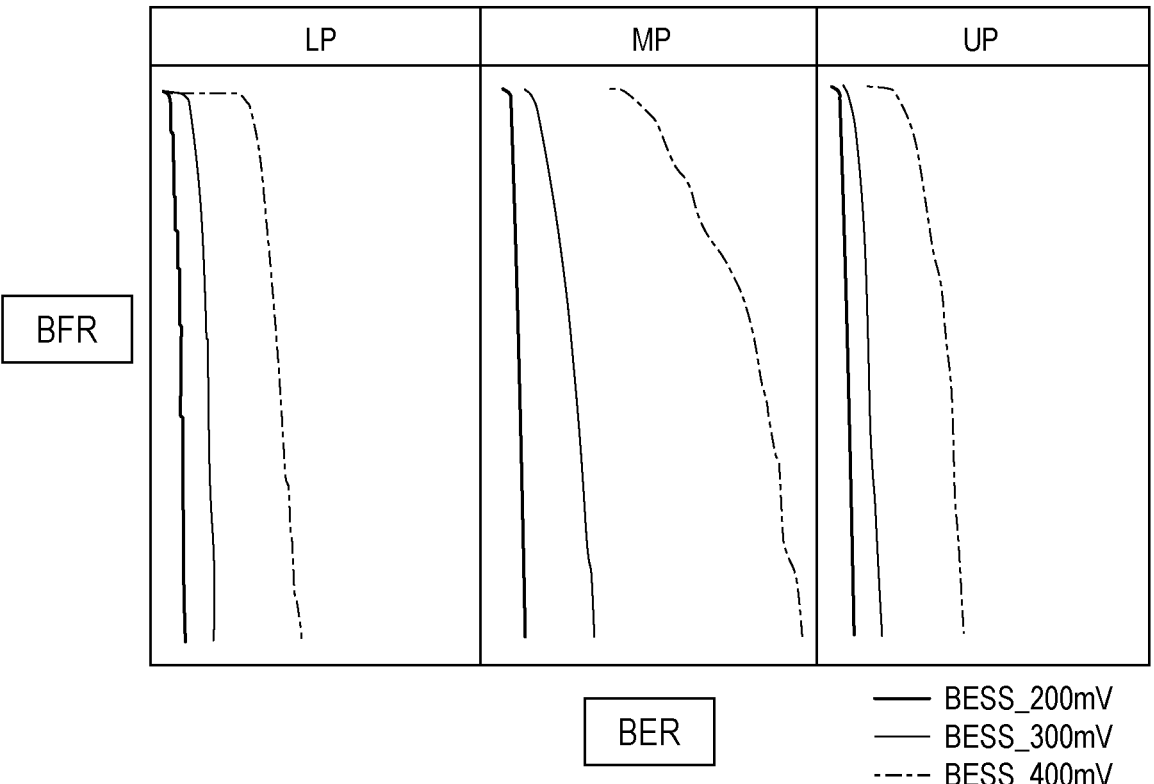
FIG. 4 is a graph of an embodiment in which a bit error rate (BER) estimation scan (BES) delta is expanded.
Figure 5:
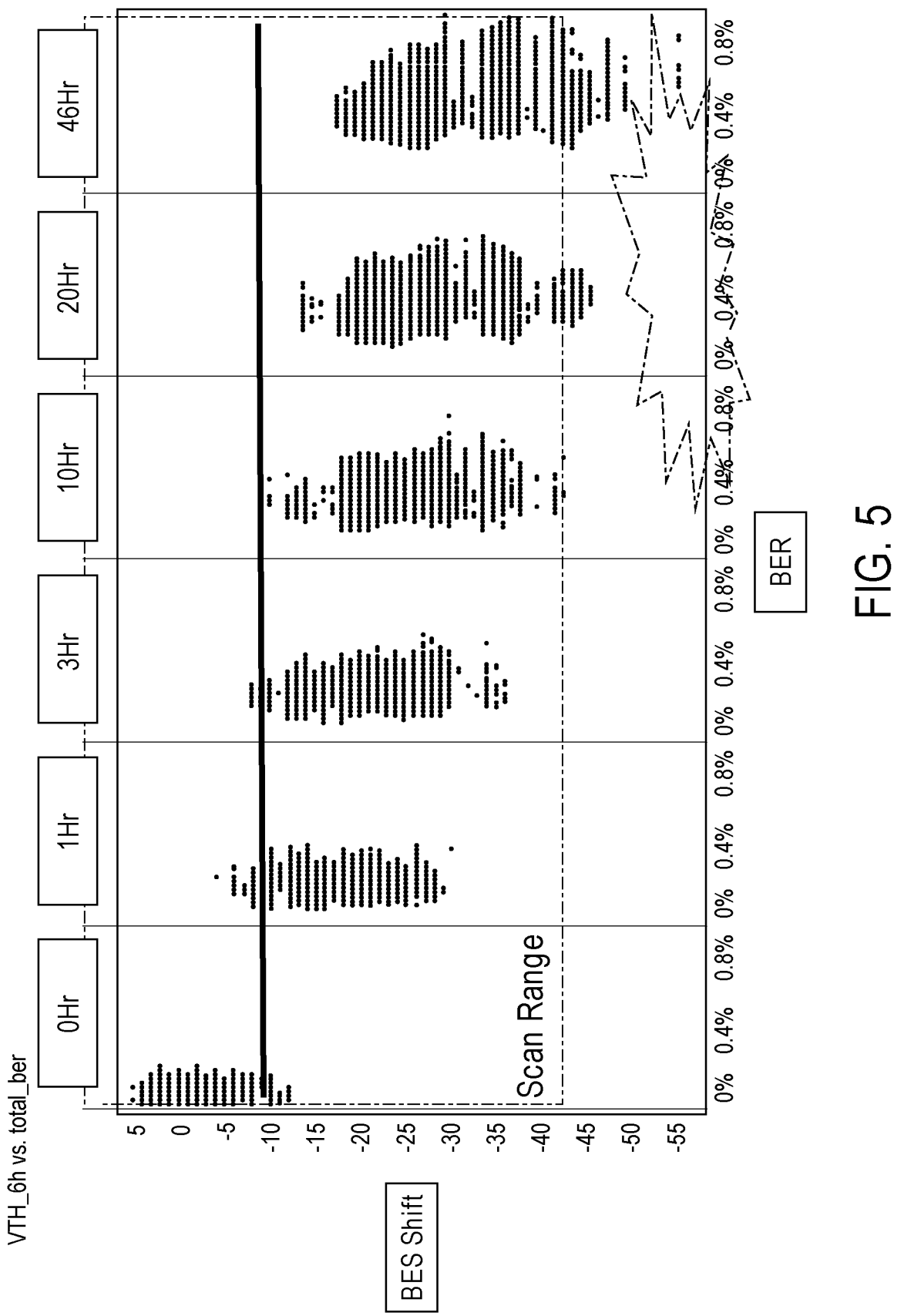
FIG. 5 is a graph of an embodiment in which a BES offset is adjusted.

As more wordlines are introduced into memory dies, such as a three-dimensional NAND bit column stacked (BiCS) memory, the scan range of BES5 can become insufficient. For example, there may be pages that cannot be covered by the BES5 scan range even when the bit error rate (BER) of those pages is still relatively low, and they show high shifts. Several approaches can be used to resolve this problem. For example, the BES5 delta can be expanded. However, as shown in FIG. 4, expanding the BES5 delta can worsen BER/SW, as this approach can be less accurate and result in a higher syndrome weight. In another approach, the initial BES5 offset can be adjusted. As shown in FIG. 5, while this approach can provide short-term improvement, coverage can still be limited by the BES5 delta. In yet another approach, the BES5 offest can be dynamically adjusted for pages that show high BES shifts even when BER is low. can help solve this problem.

Figure 6:
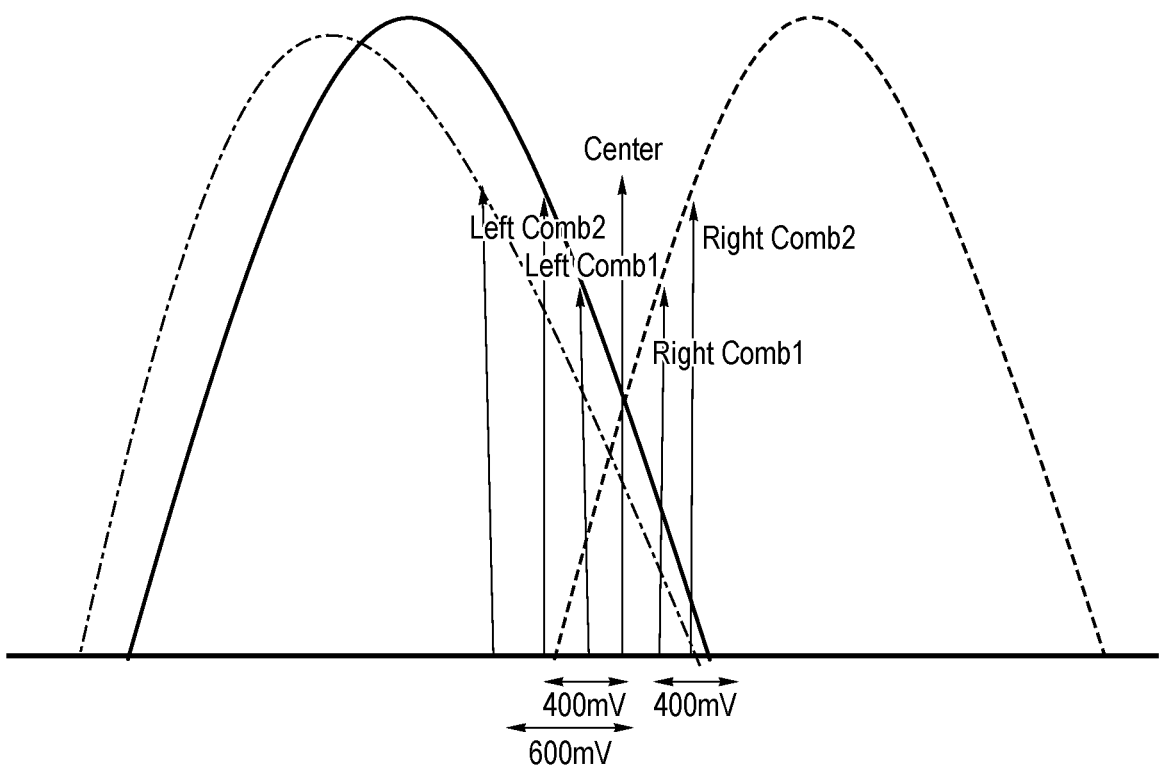
FIG. 6 is a graph of a BES range of an embodiment.

In one example, a device bench data shows ~−50 digital-to-analog conversion (DAC) (~600 mV) as the optimal shift for certain data retention conditions. In this case, the BES shift scan range is 400 mV for BES5 and 300 mV for BES7 (BES5 delta=200 mV, BES7 delta=100 mV). In this case, if BES5 is not able to find an optimal read level, it may choose the best out of the worst five levels. That can mean choosing a level with not enough shift. For example, when choosing the best-of-the-worst levels, if BES5 considers Right Comb1 as the best level, even BES7 will not be able to scan and find the most-optimum read level that lies at −50 DAC from reference read level. Hence, the data storage device will see failures with BES shifts being less negative as the data storage device data passes. With reference to FIG. 6, Vt dist in dashed line represents DR Vt with Ea=1.0 CV for 495 Hrs@95 C. Device data for such distribution shows optimal BES shifts of 50 DAC (−600 mV), which is out of range for BES. Hence, failures will be seen at the system level.

Figure 7:
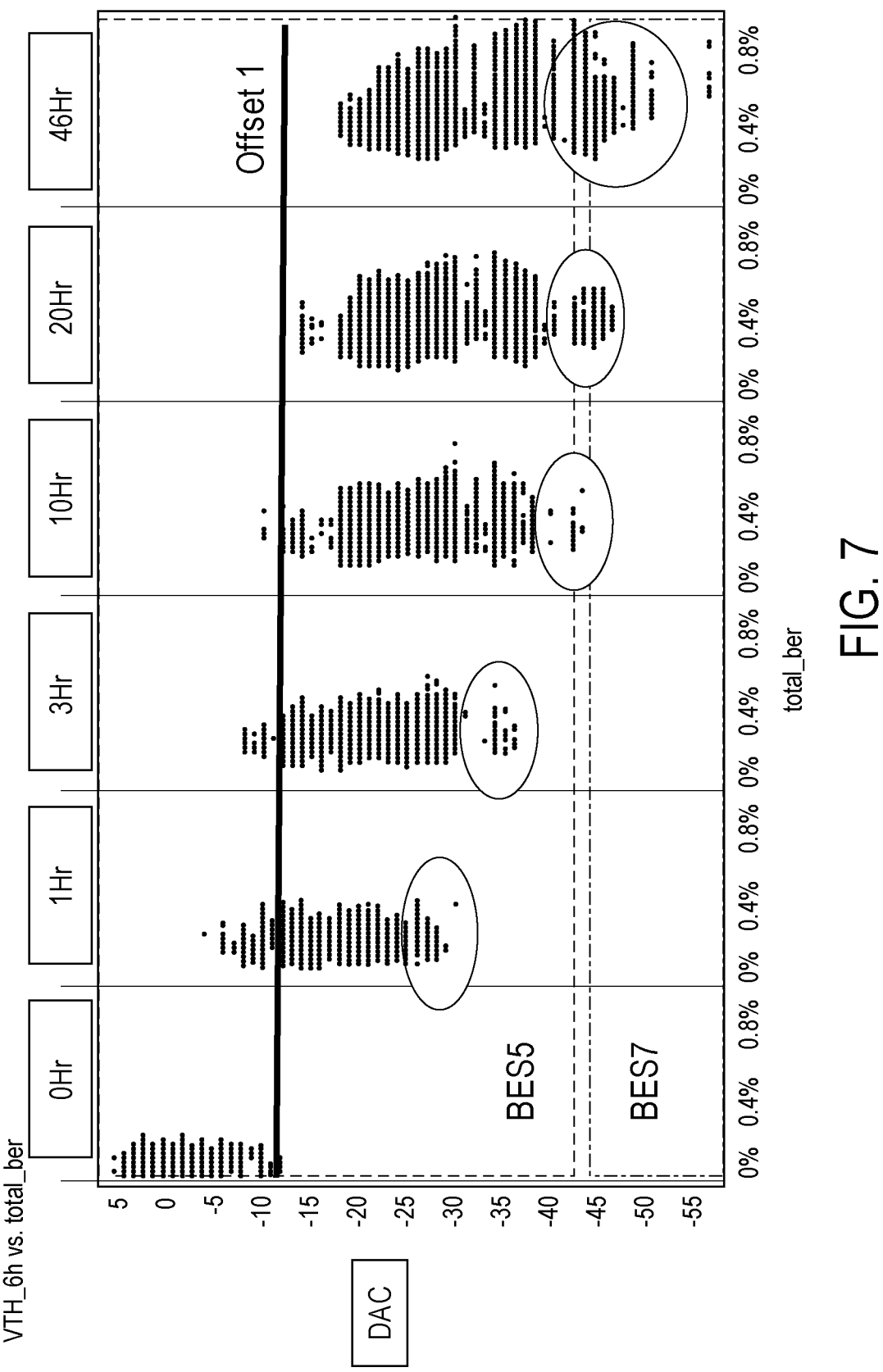
FIG. 7 is a graph of an embodiment in which a high temperature data retention BES range is limited.
Figure 8:
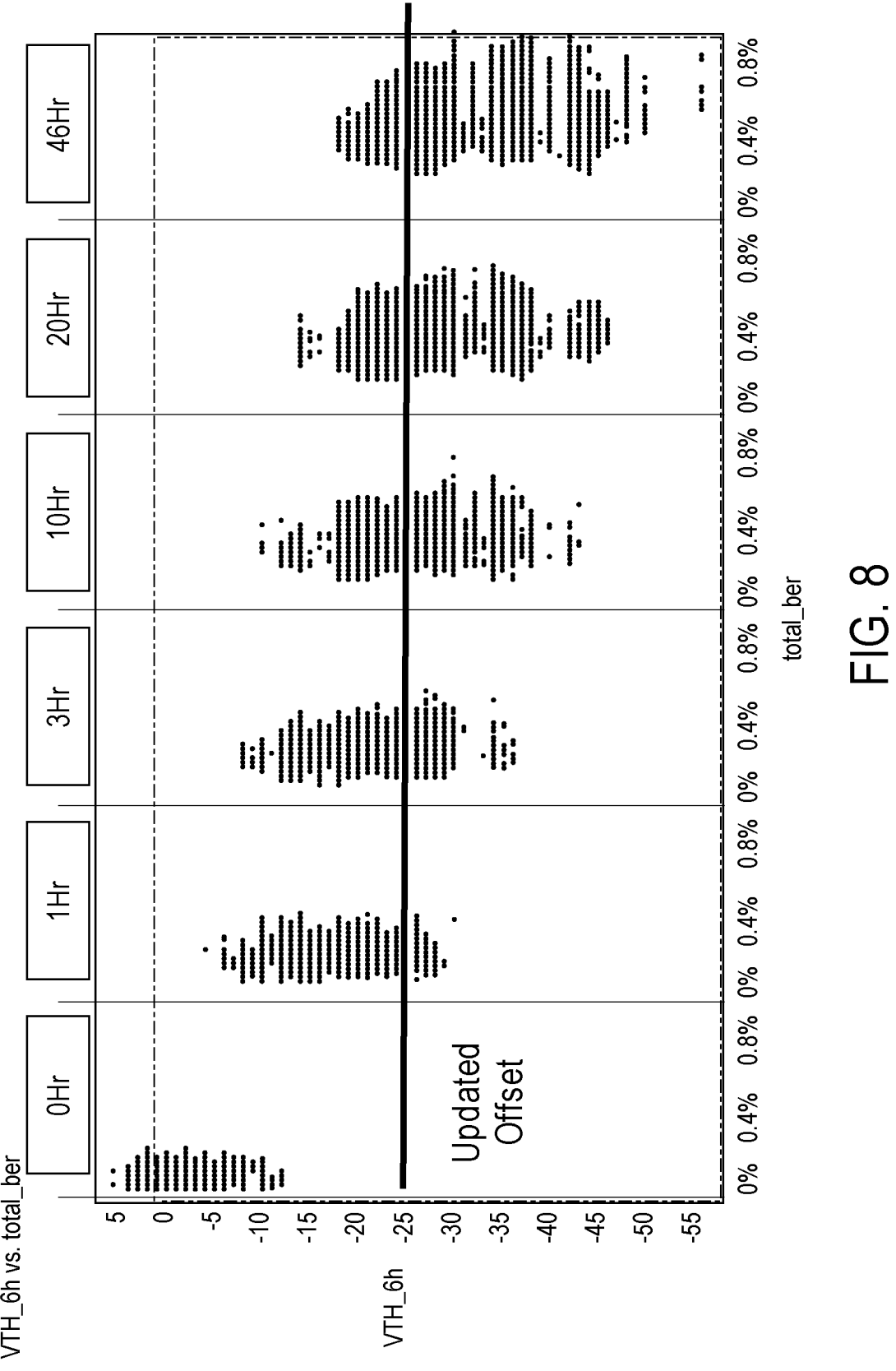
FIG. 8 is a graph of an embodiment in which a high temperature data retention BES range has a dynamic BES offset.

To resolve this issue, in one embodiment, a dynamic BES5 offset approach can be used. In this approach, the controller 102 of the data storage device 100 identifies a page in the memory 104 comprising DAC shifts below a criterion (e.g., a TLC page with the worse offset based on drive level statistics) and applies a second BES5 offset. This can be done by monitoring syndrome weight versus BES5 shifts. For example, if the BES shifts are very high even when BER/SW is not too high, the controller 102 can device to use the additional BES5 offset. FIG. 7 shows a plot of DAC shifts versus BER as seen during high temperature data retention condition. As the time interval increases, it can be seen that DAC shifts become increasingly negative and go out of the BES range. Hence, the high temperature data retention BES range is limited. FIG. 8 shows how the updated dynamic BES5 offset can provide more scan coverage and can also reduce BES7 triggers.

Figure 9:
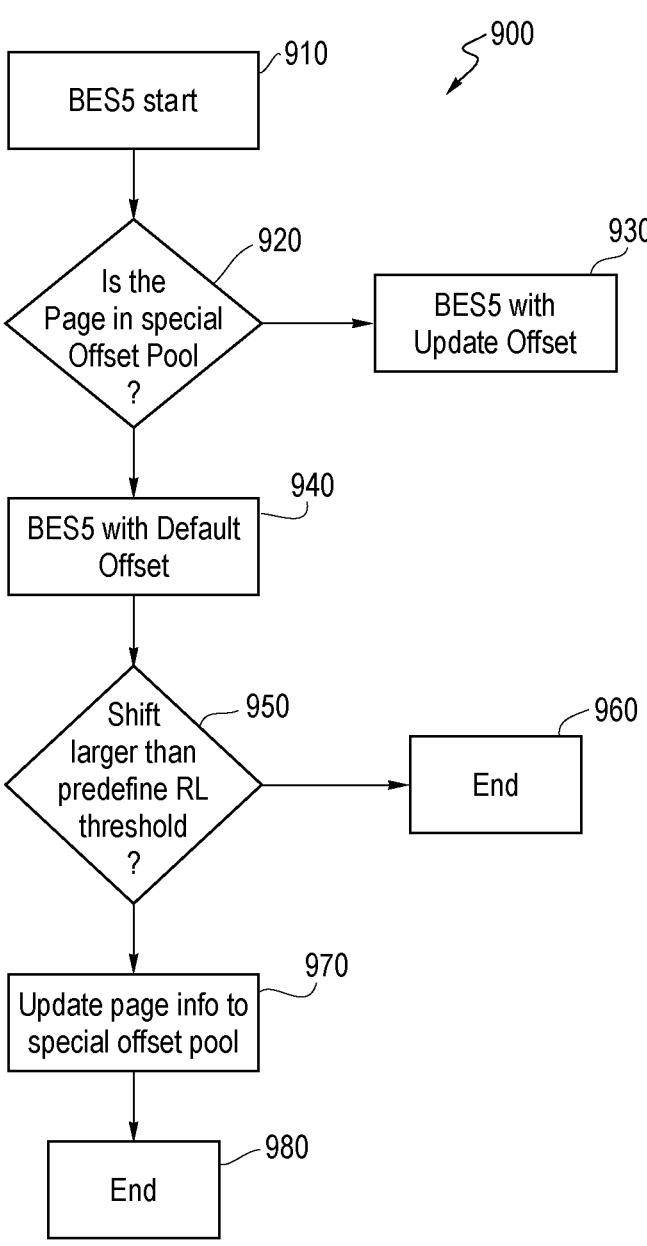
FIG. 9 is a flow chart of a dynamic BES offset method of an embodiment.

FIG. 9 is a flow chart 900 of a dynamic BES offset method of an embodiment. As shown in FIG. 9, after BES5 starts (910), the controller 102 of the data storage device 100 determines if the page being read is in a special offset pool (920). If it is, the controller 102 proceeds with BES5 with an updated offset (930). If it isn't, the controller 102 proceeds with BES5 with a default offset (940). The controller 102 then determines if the shift is larger than a predefined read level (RL) threshold (950). If it is, the method ends (960). If it isn't, the controller 102 updates the page information to place the page in the special offset pool (970), after which the method ends (980).

With this method, for a fresh data storage device, the special offset pool list would be empty, as this pool would contain the list of pages that use a non-default BES5 offset. This list can be based on a wordline, string, or page identifier. In this method, if a BES5 results in BES shifts greater than the predefined threshold, the page will be added to the special offset pool. Whenever BES is triggered on a page, it will be checked if it is already a part of the special offset pool. If it is, the BES5 operation will use a non-default (updated) BES offset. There are several advantages associated with these embodiments. For example, these embodiments can reduce the BES7 trigger rate and provide more-reliable read error handling. This can provide a better quality of service (QoS) with enhanced reliability.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two-dimensional configuration, e.g., in an x-z plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three-dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A data storage device comprising:
a memory; and
one or more processors, individually or in combination, configured to:
    perform a first bit-error-rate estimation scan (BES) on a scan range in the memory, wherein the BES is performed using a first offset;
    determine whether a page in the scan range comprises DAC shifts below a criterion; and
    in response to determining that the page in the scan range comprises DAC shifts below the criterion, perform a second BES on the page, wherein the second BES is performed using a second offset.

2. The data storage device of claim 1, wherein the one or more processors, individually or in combination, are further configured to determine whether the page in the scan range comprises DAC shifts below the criterion by monitoring syndrome weight versus BES shifts.

3. The data storage device of claim 1, wherein the one or more processors, individually or in combination, are further configured to determine whether the page in the scan range comprises DAC shifts below the criterion by determining whether the DAC shifts are becoming increasingly negative and out of a range.

4. The data storage device of claim 1, wherein the one or more processors, individually or in combination, are further configured to determine whether the page in the scan range comprises DAC shifts below the criterion by determining whether the page comprises an offset based on data-storage-device-level statistics.

5. The data storage device of claim 1, wherein the BES comprises BES5, which performs five memory senses.

6. The data storage device of claim 5, wherein performing the second BES using the second offset avoids performing BES7, which performs seven memory senses.

7. The data storage device of claim 1, wherein the page in the scan range comprises DAC shifts below the criterion in response to a first data retention condition.

8. The data storage device of claim 1, wherein the memory comprises multi-level memory cells.

9. The data storage device of claim 1, wherein the memory comprises a three-dimensional memory.

10. The data storage device of claim 1, wherein memory comprises a two-dimensional memory.

11. A storage system comprising:

a memory; and means for:

performing a first bit-error-rate estimation scan (BES) on a scan range in the memory, wherein the BES is performed using a first offset;

identifying a page in the scan range that comprises DAC shifts below a criterion; and performing a second BES on the page, wherein the second BES is performed using a second offset.

12. In a data storage device comprising a memory, a method comprising:

performing a first bit-error-rate estimation scan (BES) on a scan range in the memory, wherein the BES is performed using a first offset;

determining whether a page in the scan range comprises DAC shifts below a criterion; and in response to determining that the page in the scan range comprises DAC shifts below the criterion, performing a second BES on the page, wherein the second BES is performed using a second offset.

13. The method of claim 12, further comprising:

determining whether the page in the scan range comprises DAC shifts below the criterion by monitoring syndrome weight versus BES shifts.

14. The method of claim 12, further comprising:

determining whether the page in the scan range comprises DAC shifts below the criterion by determining whether the DAC shifts are becoming increasingly negative and out of a range.

15. The method of claim 12, further comprising:

Determining whether the page in the scan range comprises DAC shifts below the criterion by determining whether the page comprises an offset based on data-storage-device-level statistics.

16. The method of claim 12, wherein the BES comprises BES5, which performs five memory senses.

17. The method of claim 16, wherein performing the second BES using the second offset avoids performing BES7, which performs seven memory senses.

18. The method of claim 12, wherein the page in the scan range comprises DAC shifts below the criterion in response to a first data retention condition.

19. The method of claim 12, wherein the memory comprises multi-level memory cells.

20. The method of claim 12, wherein the memory comprises a three-dimensional memory.

\* \* \* \* \*